United States Patent [19]
Mueller et al.

[11] Patent Number: 6,000,902
[45] Date of Patent: Dec. 14, 1999

[54] COMPONENT FLIPPING METHOD AND APPARATUS

[75] Inventors: Claude Mueller, Vista; Roy Alexander Darling, Encinitas, both of Calif.

[73] Assignee: Ismecam, Inc., Vista, Calif.

[21] Appl. No.: 09/212,640

[22] Filed: Dec. 16, 1998

[51] Int. Cl.$^6$ ................................................. B65G 47/248
[52] U.S. Cl. .......................... 414/758; 414/764; 414/766; 414/816
[58] Field of Search .................................. 198/404, 408, 198/402; 414/405, 758, 761, 762, 764, 765, 766, 767, 773, 777, 778, 782, 783, 816

[56] References Cited

U.S. PATENT DOCUMENTS

| | | | |
|---|---|---|---|
| 3,122,112 | 2/1964 | Kline | 414/766 X |
| 3,127,974 | 4/1964 | Kelley | 414/758 X |
| 4,331,416 | 5/1982 | Berecz | 414/758 X |
| 5,403,146 | 4/1995 | Jones | 414/758 X |

FOREIGN PATENT DOCUMENTS

| 1087429 | 4/1984 | U.S.S.R. | 198/408 |
|---|---|---|---|

*Primary Examiner*—Janice L. Krizek
*Attorney, Agent, or Firm*—Merle W. Richman, III

[57] ABSTRACT

A method and apparatus for flipping or rotating a component 180 degrees. The apparatus includes a rotatable plate having a component opening where the component may pass through and a top and a bottom shutter where when the plate is rotated in a first direction, the top shutter closes and the bottom shutter opens and when the plate is rotated in a second, opposite direction, the bottom shutter closes and the top shutter opens. The top shutter and the bottom shutter may be coupled to a proximal and distal cam following bearing where the proximal and distal cam following bearings are located within a proximal and distal cam slot of a cam barrel.

24 Claims, 7 Drawing Sheets

COMPONENT FLIPPING METHOD AND APPARATUS

BACKGROUND OF THE INVENTION

1. Field of the Invention

This invention relates to systems and methods for flipping or rotating components on an axis 180° and more particularly to systems and methods for flipping or rotating electrical components on a horizontal axis 180°.

2. Description of Related Art

Component handling machines exist that take small components and place them in embossed tape for further processing by other machines or installation in a circuit, e.g., for electrical components. The components may be segments of a wafer cut and singulated as a die or stored in tubes. The component handling machine processes the components by singularly selecting and placing the component in a segment of the embossed tape. The machine may also inspect the component prior to placement in the tape. The components are commonly rectangular in shape have a primary top and bottom section where the sides are relatively small in comparison, e.g., a microprocessor.

Ideally, the components are oriented before placement in the embossed tape to simplify the processing of the components when removed from the tape. In particular, some components are ideally stored with their bottom section face up in the embossed tape. The requirement to orient the component may complicate the process or apparatus handling the components. For example, the components may be feed or available to the process or apparatus with a top orientation while future processing or apparatus of the components requires the components to have a bottom orientation. Accordingly, some processes or apparatus include steps or equipment to flip or rotate components on the horizontal axis 180 degrees.

The steps or equipment used to flip or rotate the components is usually complex and large. This in turn increases component handling costs, due to increased process steps, equipment size, or maintenance requirements. The need thus exists for a less complex method and apparatus for flipping or rotating components 180°.

SUMMARY OF THE INVENTION

The present invention is a method and apparatus for rotating a component from a top side to a bottom side. The apparatus includes a plate having a top side and a bottom side and a component opening where the component may pass through. The plate also has a first shutter slidably coupled to the top side of the plate and a second shutter slidably coupled to the bottom side of the plate. When the plate is rotated in a first direction, the first shutter slides to a closed position over the component opening and the second shutter slides to an open position over the component opening exposing the opposite side of the component. In addition, when the plate is rotated a second direction, opposite of the first direction, the first shutter slides to an open position over the component opening and the second shutter slides to a closed position over the component opening. This flips or rotates a component placed in the opening.

In another embodiment, the apparatus may include a rotary drive coupled to the plate and a bi-directional motor coupled to the rotary drive. In this embodiment, the motor is activated to operate in a first motor direction to rotate the plate in the first direction and the motor is activated to operate in a second motor direction to rotate the plate in the second direction. It is noted that the component may be an electrical component. Further, the component may be an integrated circuit. Further, the opening of the plate preferably includes a tool insert where the tool insert has an opening with a size and shape substantially the same as the size and shape of the outline of the component.

In a further embodiment, the apparatus may include a cam barrel encircling the plate. In this embodiment, the plate rotates within the cam barrel. The cam barrel includes a proximal cam slot and distal cam slot where the proximal cam slot is closer to the opening of the plate. The apparatus also includes a proximal cam following bearing where the proximal cam bearing is operatively coupled to the top shutter and located within the proximal cam slot. The apparatus further includes a distal cam following bearing where the distal cam bearing is operatively coupled to the bottom shutter and located within the distal cam slot.

In this embodiment, when the plate is rotated in a first direction the proximal cam following bearing moves toward the opening of the plate sliding the first shutter toward a closed position over the component opening and the distal cam following bearing moves away from the opening of the plate sliding the second shutter toward an open position over the component opening. In addition, when the plate is rotated in a second, opposite direction the distal cam following bearing moves toward the opening of the plate sliding the second shutter toward a closed position over the component opening and the proximal cam following bearing moves away from the opening of the plate sliding the first shutter toward an open position over the component opening.

The present invention also includes a method of rotating a component from a top side to a bottom side. The method includes inserting the component top side up in a component opening of a plate where the component may pass through the opening and the plate has a first shutter slidably coupled to the top side of the plate and a second shutter slidably coupled to the bottom side of the plate. The plate is rotated in a first direction 180 degrees to slide the first shutter to a closed position over the component opening and to slide the second shutter to an open position over the component opening. Then, the component is removed bottom side up from the opening in the plate. As for the apparatus, the component may be an electrical component. Further, the component may be an integrated circuit.

The present invention also includes a method of rotating a first and a second component from a top side to a bottom side. The method includes inserting the first component top side up in an opening of a plate where the component may pass through the opening and the plate has a first shutter slidably coupled to the top side of the plate and a second shutter slidably coupled to the bottom side of the plate. The plate is rotated in a first direction 180 degrees to slide the first shutter to a closed position over the component opening and to slide the second shutter to an open position over the component opening. Then, the first component is removed bottom side up from the opening in the plate. Next, the second component is inserted top side up in the opening of the plate. The plate is rotated in a second, opposite direction 180 degrees to slide the second shutter to a closed position over the component opening and to slide the first shutter to an open position over the component opening. Then, the second component is removed bottom side up from the opening in the plate.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 1:
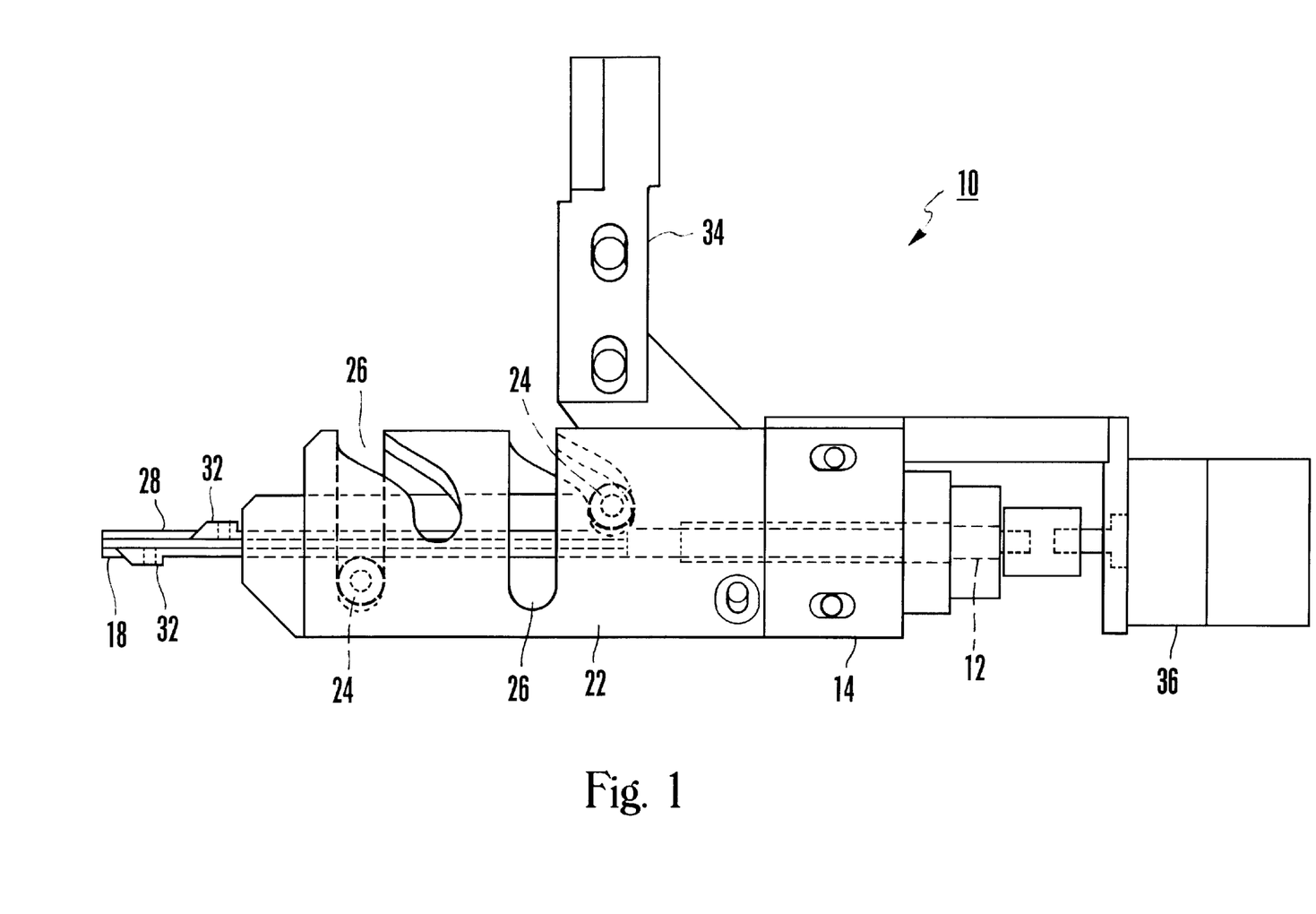
FIG. 1 is a side view of an exemplary flipper apparatus according to the present invention with a support.
Figure 2:
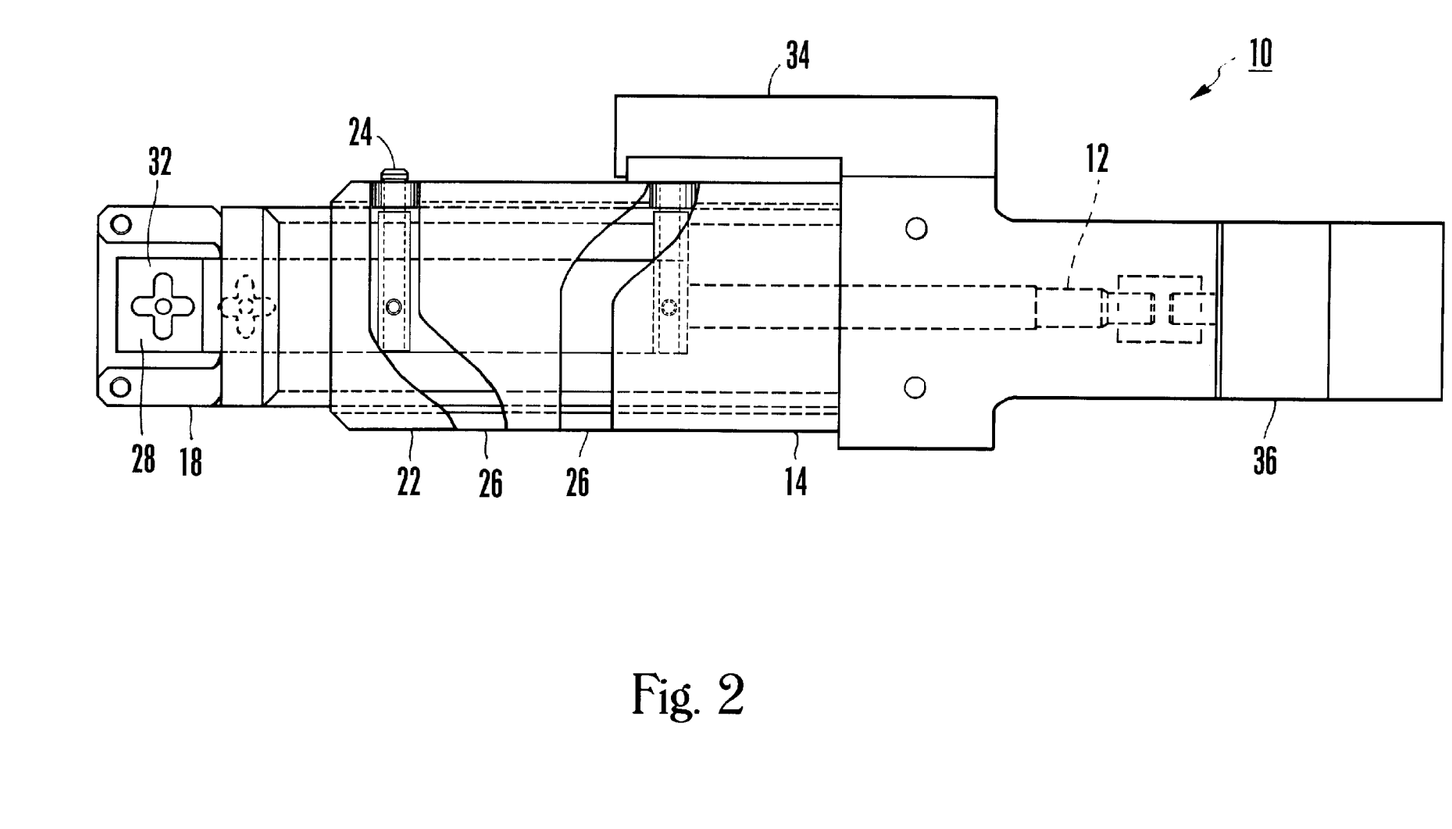
FIG. 2 is a top view of an exemplary flipper apparatus according to the present invention.

An exemplar embodiment of a flipper apparatus 10 according to the invention is presented with reference to FIGS. 1 to 7. FIGS. 1–2 are views of the flipper apparatus 10 with a support 34. FIGS. 3 to 7 are views of the flipper apparatus 10 with a frame 16. FIG. 1 is a side view of the flipper apparatus 10. FIG. 2 is a top view of the flipper apparatus 10. FIGS. 3 to 7 are isometric views of the flipper apparatus 10 in various states of operation. As shown in these FIGURES, the apparatus 10 includes a rotary drive 12, a housing 14, a plate 18, a cam barrel 22, two cam following bearings 24, two cam slots 26, a tool insert 28, two shutters 32, a support 34, and a motor 36. In this embodiment, the rotary drive 12 is connected to the plate 18 and the bi-directional motor 36. The plate 18 includes a middle section on both sides wherein a moveable shutter 32 is displaced. Each shutter 32 is coupled to a separate cam following bearing 24 where each cam following bearing is located within a cam slot 26. As stated above, the apparatus 10 may also include a support 34 or a frame 16.

As shown FIGS. 3 to 7, the apparatus 10 includes a cam barrel 22 coupled to the frame 16 of the apparatus. The two cam slots 26 are displaced in the cam barrel 22 where there is a proximal and a distal cam slot 26. It is further noted that the plate 18 is rotatably connected to the frame 16. In FIGS. 1 to 2, the apparatus 10 includes a cam barrel 22 coupled to a support 34. As will be explained with reference to FIGS. 3–7 below, in either case when the bi-directional motor 36 rotates the plate 18 via the rotary drive 12 in a first direction, one of the two shutters 32 closes, the plate 18 rotates 180° and the other of the two shutters 32 opens. Likewise, when the bi-directional motor 36 rotates the plate 18 via the rotary drive 12 in a second direction opposite from the one direction, the other of the two shutters 32 closes, the plate 18 rotates 180° in the other direction and the one of the two shutters 32 opens. Thus, when a component is placed in the tool insert 28 of the plate 18 and the bi-directional motor 36 is engaged, the component is rotated 180° and made available for withdrawal from the tool insert 28.

It is noted that the plate 18 includes an opening that is large enough for the component to pass through. The preferred embodiment of the plate 18 includes a tool insert 28. The tool insert ideally has an opening with a size and shape substantially similar to the size and shape of the outline of the component but large enough so the component may easily pass through. In this preferred embodiment, different tool inserts 28 may used for different sized and shaped components to hold the component steady during rotation of the plate 18.

Figure 3:
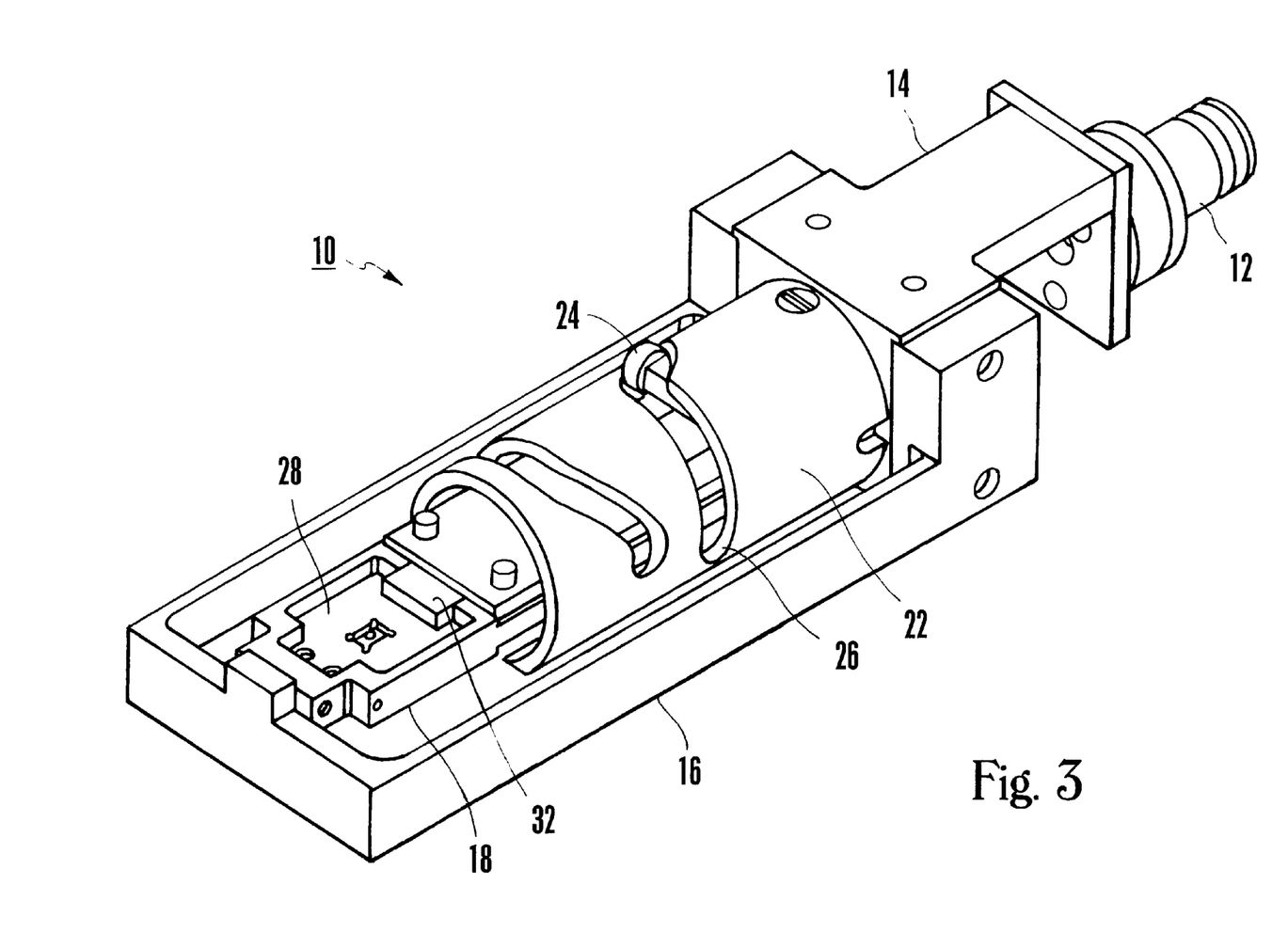
FIG. 3 is an isometric diagram of the exemplary flipper apparatus shown in FIGS. 1 and 2 with a frame and with the plate at a start position (0°).
Figure 4:
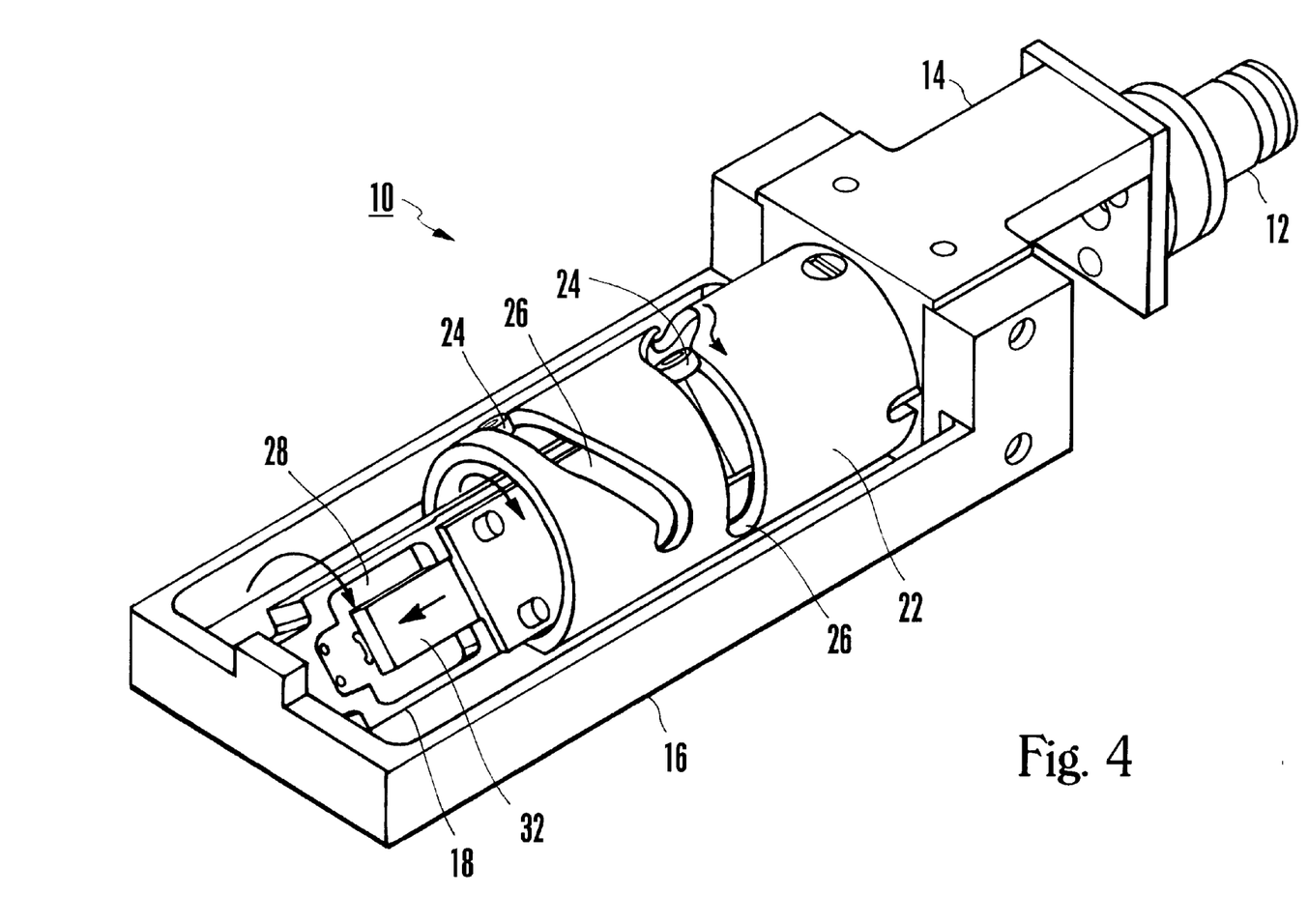
FIG. 4 is an isometric diagram of the exemplary flipper apparatus shown in FIGS. 1 and 2 with the plate at an intermediate position (45°).

As noted, an example of the method of operation of the flipper apparatus 10 is explained with reference to FIGS. 3 to 7. FIG. 3 is an isometric diagram of the flipper apparatus 10 at an initial or starting state. A component such as an integrated circuit may be placed in an opening of the tool insert 28. Then rotary drive 12 may be rotated in a clockwise direction. Upon the initiation of the clockwise rotation of drive 12, plate 18 is also rotated clockwise. In addition, the distal (distal to the tool insert 28) cam following bearing 24 is moved within the distal cam slot 26 thus causing the top shutter 32 to start to slide across the tool insert 28 and thus the component. FIG. 4 is an isometric diagram of the flipper apparatus 10 rotated 45°. As shown, the top shutter 32 is closing as the plate 18 is rotated. In addition, the distal cam following bearing 24 has moved along the distal cam slot 26 or along a cam face. A component within the opening of the tool insert 28 will not be displaced during the rotation of the plate 18 due to the top shutter 32 closing or sliding proximally.

Figure 5:
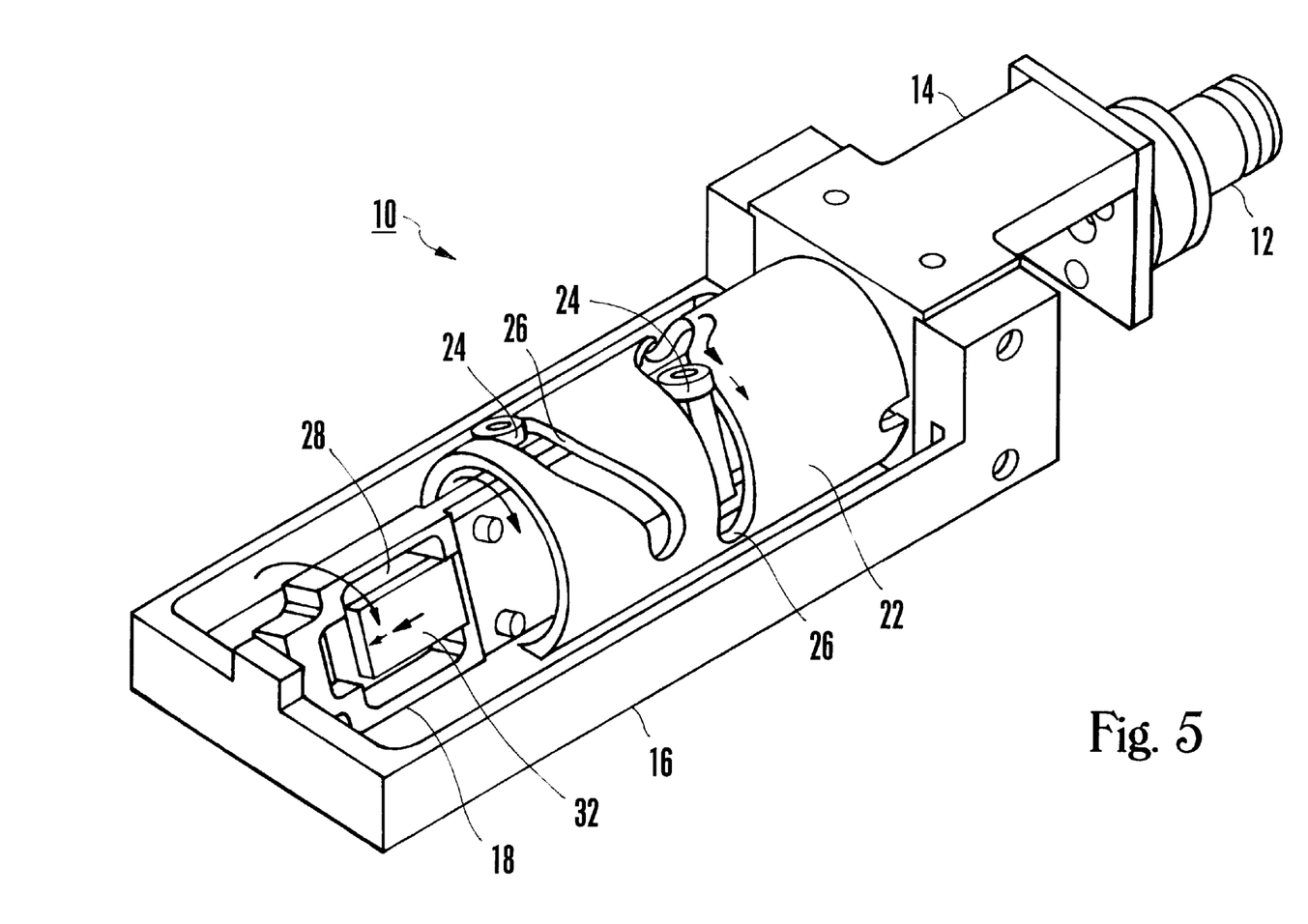
FIG. 5 is an isometric diagram of the exemplary flipper apparatus shown in FIGS. 1 and 2 with the plate at an intermediate position (65°).
Figure 6:
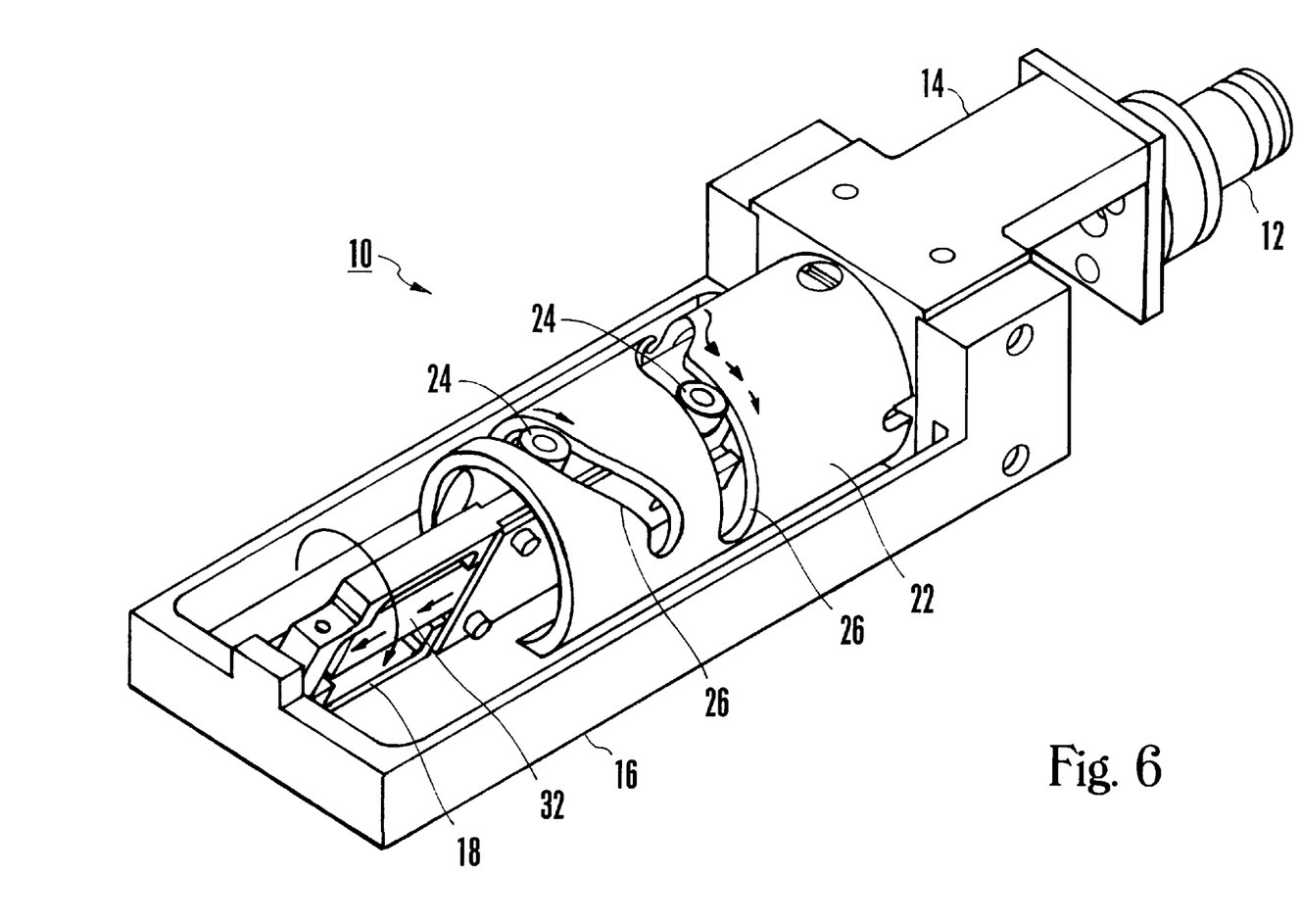
FIG. 6 is an isometric diagram of the exemplary flipper apparatus shown in FIGS. 1 and 2 with the plate at an intermediate position (120°).

FIG. 5 is an isometric diagram of the flipper apparatus 10 rotated 65°. As shown, the top shutter 32 is completely closed while the plate 18 continues to be rotated. In addition, the distal cam following bearing 24 has moved along a vertical segment of the distal cam slot 26. Consequently the shutter 32 will not close any further. At the same time the proximal cam following bearing 24 is also in a vertical segment of the proximal cam slot 26. Consequently, the bottom shutter remains closed. FIG. 6 is an isometric diagram of the flipper apparatus 10 rotated 120°. As before, the top shutter 32 is completely closed while the plate 18 continues to be rotated. The distal cam following bearing 24 also continues to move along the vertical segment of the distal cam slot 26. The proximal cam following bearing 24 has started to enter a curved section of the proximal cam slot 26. Consequently, the bottom shutter has started to open.

Figure 7:
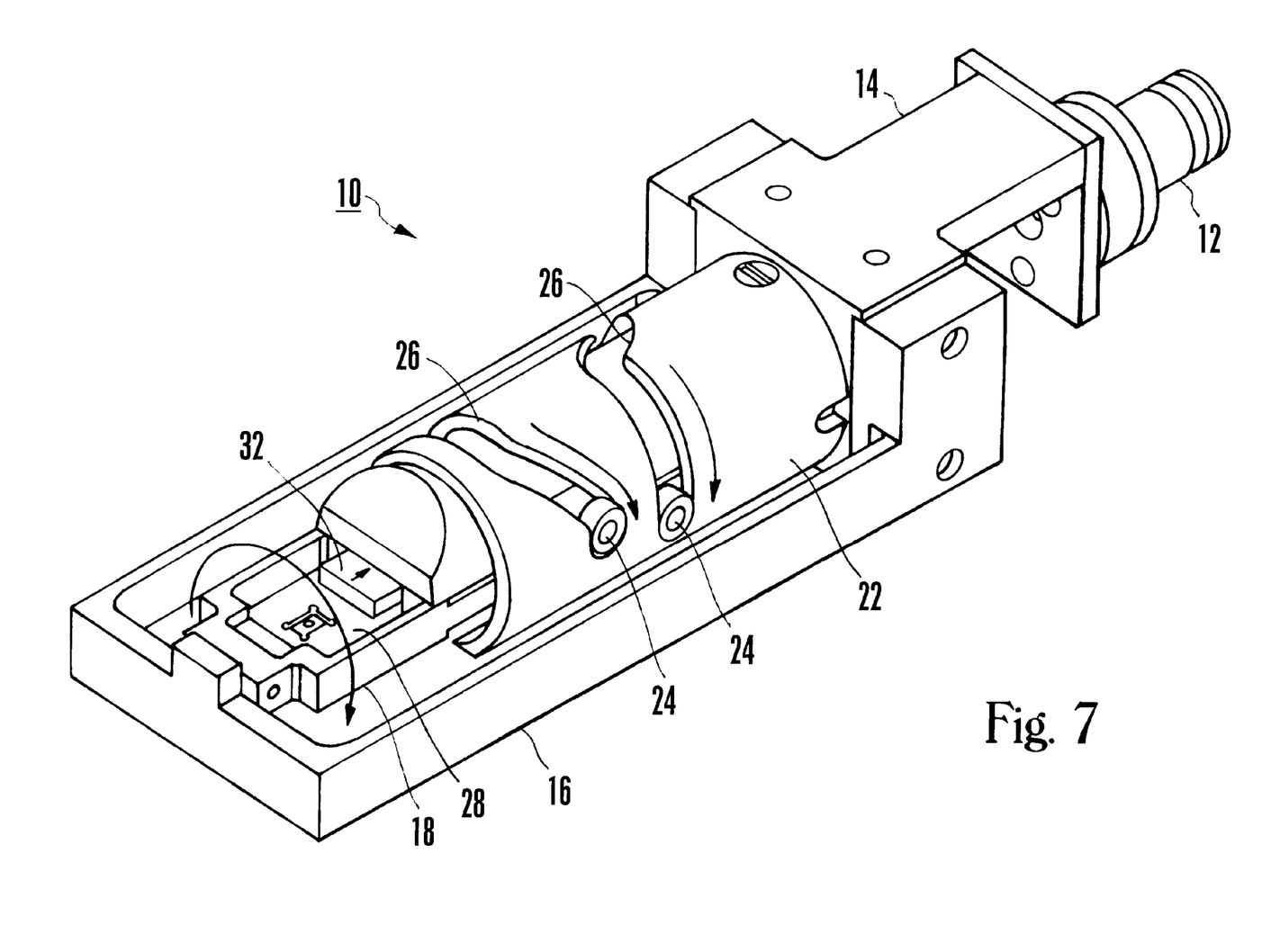
FIG. 7 is an isometric diagram of the exemplary flipper apparatus shown in FIGS. 1 and 2 with the plate at an end position (180°).

FIG. 7 is an isometric diagram of the flipper apparatus 10 rotated 180°. At this point the bottom shutter 32 is completely open and plate 18 has completed its rotation. In addition, the component has been rotated or flipped completely over to a bottom position. The proximal and distal cam following bearings 24 have reached the bottom segment of the proximal and distal cam slots 26, which prevents the plate from rotating any further. At this point, the component can be removed bottom side up. As noted different size tool inserts 28 may be employed as a function of the size and shape of the components to be rotated or flipped. At this time another component may be placed in the flipper apparatus 10 top side up. Then, the motor 36 may rotate the plate in an opposite direction 180° to flip the component over to its bottom side. Thus, variations of the above techniques are possible. Consequently, the invention is not to be limited by the specific illustrated embodiment, but only by the scope of the appended claims.

What is claimed is:

1. An apparatus for rotating a component from a top side to a bottom side, the apparatus comprising:

a) a plate having a top side and a bottom side and a component opening where the component may pass through the opening, the plate including:

i) a first shutter slidably coupled to the top side of the plate; and ii) a second shutter slidably coupled to the bottom side of the plate;

wherein upon the rotation of the plate in a first direction the first shutter slides to a closed position over the component opening and the second shutter slides to an open position over the component opening.

2. The apparatus according to claim 1, wherein upon the rotation of the plate in a second direction, opposite of the first direction, the first shutter slides to an open position over the component opening and the second shutter slides to a closed position over the component opening.

3. The apparatus according to claim 1, wherein the apparatus further comprising:

a) a rotary drive coupled to the plate; and b) a bi-directional motor coupled to the rotary drive, wherein activation of the motor in a first motor direction causes the plate to rotate in the first direction and activation of the motor in a second motor direction causes the plate to rotate in the second direction.

4. The apparatus according to claim 1, wherein the component is an electrical component.

5. The apparatus according to claim 3, wherein the component is an integrated circuit.

6. The apparatus according to claim 3, wherein the component has a particular size and shape and wherein the component opening of the plate includes a tool insert where the tool insert has an opening with a size and shape substantially the same as the size and shape of the outline of the component.

7. The apparatus according to claim 3, the apparatus further comprising:

a) a cam barrel encircling the plate wherein the plate may rotate within the cam barrel, the cam barrel including:
    i) a proximal cam slot, the proximal cam slot being proximal to the opening of the plate; and
    ii) a distal cam slot, the distal cam slot being distal to the opening of the plate as compared to the proximal cam slot;

b) a proximal cam following bearing, the proximal cam bearing being operatively coupled to the first shutter and within the proximal cam slot; and c) a distal cam following bearing, the distal cam bearing being operatively coupled to the second shutter and within the distal cam slot, wherein upon the rotation of the plate in a first direction the proximal cam following bearing moves toward the opening of the plate sliding the first shutter toward a closed position over the component opening and the distal cam following bearing moves away from the opening of the plate sliding the second shutter toward an open position over the component opening, and wherein upon the rotation of the plate in a second direction the distal cam following bearing moves toward the opening of the plate sliding the second shutter toward a closed position over the component opening and the proximal cam following bearing moves away from the opening of the plate sliding the first shutter toward an open position over the component opening.

8. The apparatus according to claim 1, wherein the apparatus further comprising:

a) a rotary drive coupled to the plate and through a frame; and b) a bi-directional motor coupled to the rotary drive, wherein activation of the motor in a first motor direction causes the plate to rotate in the first direction and activation of the motor in a second motor direction causes the plate to rotate in the second direction.

9. The apparatus according to claim 8, wherein the component is an electrical component.

10. The apparatus according to claim 8, wherein the component is an integrated circuit.

11. The apparatus according to claim 8, wherein the component has a particular size and shape and wherein the component opening of the plate includes a tool insert where the tool insert has an opening with a size and shape substantially the same as the size and shape of the outline of the component.

12. A method of rotating a component from a top side to a bottom side, the method comprising the steps of:

a) inserting the component top side up in a component opening of a plate where the component may pass through the component opening and the plate has a first shutter slidably coupled to the top side of the plate and a second shutter slidably coupled to the bottom side of the plate;

b) rotating the plate in a first direction 180 degrees to slide the first shutter to a closed position over the component opening and to slide the second shutter to an open position over the component opening; and c) removing the component bottom side up from the opening in the plate.

13. The method according to claim 12, wherein the component is an electrical component.

14. The method according to claim 12, wherein the component is an integrated circuit.

15. A method of rotating a first and a second component from a top side to a bottom side, the method comprising the steps of:

a) inserting the first component top side up in a component opening of a plate where the first and the second component may pass through the component opening and the plate has a first shutter slidably coupled to the top side of the plate and a second shutter slidably coupled to the bottom side of the plate;

b) rotating the plate in a first direction 180 degrees to slide the first shutter to a closed position over the component opening and to slide the second shutter to an open position over the component opening; and c) removing the first component bottom side up from the opening in the plate;

d) inserting the second component top side up in the opening of the plate;

e) rotating the plate in a second direction 180 degrees opposite of the first direction to slide the second shutter to a closed position over the component opening and to slide the first shutter to an open position over the component opening; and f) removing the second component bottom side up from the opening in the plate.

16. The method according to claim 15, wherein the first and the second component is an electrical component.

17. The method according to claim 16, wherein the first and second component is an integrated circuit.

18. An apparatus for rotating a component from a top side to a bottom side, the apparatus comprising:

a) a frame; and b) a plate rotatably attached to the frame, the plate having a top side and a bottom side and a component opening where the component may pass through the opening, the plate including:

i) a first shutter slidably coupled to the top side of the plate; and ii) a second shutter slidably coupled to the bottom side of the plate;

wherein upon the rotation of the plate in a first direction the first shutter slides to a closed position over the component opening and the second shutter slides to an open position over the component opening.

19. The apparatus according to claim 18, wherein upon the rotation of the plate in a second direction, opposite of the first direction, the first shutter slides to an open position over the component opening and the second shutter slides to a closed position over the component opening.

20. The apparatus according to claim 18, wherein the apparatus further comprising:

a) a rotary drive coupled to the plate and through the frame; and b) a bi-directional motor coupled to the rotary drive, wherein activation of the motor in a first motor direction causes the plate to rotate in the first direction and activation of the motor in a second motor direction causes the plate to rotate in the second direction.

21. The apparatus according to claim 20, wherein the component is an electrical component.

22. The apparatus according to claim 20, wherein the component is an integrated circuit.

23. The apparatus according to claim 22, wherein the component has a particular size and shape and wherein the component opening of the plate includes a tool insert where the tool insert has an opening with a size and shape substantially the same as the size and shape of the outline of the component.

24. The apparatus according to claim 23, the apparatus further comprising:

a) a cam barrel coupled to the frame and encircling the plate wherein the plate may rotate within the cam barrel, the cam barrel including:

i) a proximal cam slot, the proximal cam slot being proximal to the opening of the plate; and ii) a distal cam slot, the distal cam slot being distal to the opening of the plate as compared to the proximal cam slot;

b) a proximal cam following bearing, the proximal cam bearing being operatively coupled to the first shutter and within the proximal cam slot; and c) a distal cam following bearing, the distal cam bearing being operatively coupled to the second shutter and within the distal cam slot, wherein upon the rotation of the plate in a first direction the proximal cam following bearing moves toward the opening of the plate sliding the first shutter toward a closed position over the component opening and the distal cam following bearing moves away from the opening of the plate sliding the second shutter toward an open position over the component opening, and wherein upon the rotation of the plate in a second direction the distal cam following bearing moves toward the opening of the plate sliding the second shutter toward a closed position over the component opening and the proximal cam following bearing moves away from the opening of the plate sliding the first shutter toward an open position over the component opening.

* * * * *